United States Patent
Graeupner

(10) Patent No.: US 7,227,616 B2
(45) Date of Patent: Jun. 5, 2007

(54) METHOD FOR IMPROVING AN OPTICAL IMAGING PROPERTY OF A PROJECTION OBJECTIVE OF A MICROLITHOGRAPHIC PROJECTION EXPOSURE APPARATUS

(75) Inventor: Paul Graeupner, Aalen (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 11/149,568

(22) Filed: Jun. 10, 2005

(65) Prior Publication Data

US 2005/0264780 A1     Dec. 1, 2005

Related U.S. Application Data

(63) Continuation of application No. PCT/EP03/01564, filed on Feb. 17, 2003.

(30) Foreign Application Priority Data

Dec. 10, 2002   (DE) ................................ 102 57 766

(51) Int. Cl.
*G03B 27/42*   (2006.01)
*G03B 27/52*   (2006.01)

(52) U.S. Cl. ............................. 355/53; 355/30; 355/62

(58) Field of Classification Search ................... 355/30, 355/53, 62; 359/822; 356/513; 250/548
See application file for complete search history.

(56) References Cited

U.S. PATENT DOCUMENTS

| 4,346,164 A | 8/1982 | Tabarelli et al. |
| 4,509,852 A | 4/1985 | Tabarelli et al. |
| 6,191,429 B1* | 2/2001 | Suwa ........................... 250/548 |
| 6,335,787 B1 | 1/2002 | Nishi |
| 2002/0001088 A1 | 1/2002 | Wegmann et al. |
| 2003/0025916 A1* | 2/2003 | Ina ............................... 356/513 |
| 2004/0042094 A1* | 3/2004 | Matsuyama .................. 359/822 |
| 2005/0146694 A1* | 7/2005 | Tokita .......................... 355/30 |

FOREIGN PATENT DOCUMENTS

| EP | 0 023 231 | 2/1981 |
| EP | 0 605 103 A1 | 7/1994 |
| EP | 0 678 768 A2 | 10/1995 |
| JP | 10-303114 | * 11/1998 |
| JP | 2002341249 | 11/2002 |
| WO | WO 99/49504 | 9/1999 |

OTHER PUBLICATIONS

International Search Report, International Application PCT/EP 03/01564, dated Oct. 13, 2004.

* cited by examiner

*Primary Examiner*—Peter B. Kim
(74) *Attorney, Agent, or Firm*—Young Basile

(57) ABSTRACT

A method is disclosed for improving an optical imaging property, for example spherical aberration or the focal length, of a projection objective of a microlithographic projection exposure apparatus. First, an immersion liquid is introduced into an interspace between a photosensitive surface and an end face of the projection objective. Then an imaging property of the projection objective is determined, for example using an interferometer or a CCD sensor arranged in an image plane of the projection objective. This imaging property is compared with a target imaging property. Finally, the temperature of the immersion liquid is changed until the determined imaging property is as close as possible to the target imaging property.

11 Claims, 4 Drawing Sheets

METHOD FOR IMPROVING AN OPTICAL IMAGING PROPERTY OF A PROJECTION OBJECTIVE OF A MICROLITHOGRAPHIC PROJECTION EXPOSURE APPARATUS

CROSS-REFERENCE TO RELATED APPLICATIONS

This is a continuation application of international application PCT/EP2003/001564, filed Feb. 17, 2003, which claims priority of German patent application DE 102 57 766.8, filed Dec. 10, 2002. The full disclosure of both earlier applications is incorporated herein by reference.

BACKGROUND OF THE INVENTION

1. Field of the Invention

The invention generally relates to microlithographic projection exposure apparatuses as are used in the manufacture of integrated circuits and other microstructured devices. More particularly, the invention relates to a method for improving an optical imaging property, for example spherical aberration or the focal length, of a projection objective of such an apparatus. The invention further relates to a microlithographic projection exposure apparatus as such.

2. Description of Related Art

It is known to change the spatial position of individual optical components, for example by using manipulators, in a projection objective of a microlithographic projection exposure apparatus in order to improve the imaging properties of the objective. The positional change of the relevant optical components is in this case carried out on the projection objective once it has finally been installed, and in general before it has yet been put into operation for the first time. This type of fine adjustment may nevertheless be carried out at a later time, for example in order to compensate for deteriorations of the imaging properties due to ageing. A procedure often adopted in these methods is to record one or more imaging properties of the projection objective by using a sensor arranged in its image plane. The way in which positional changes of individual optical components affect the imaging properties is then observed. The optical imaging properties of the projection objective can thus be optimised by adjusting the optical components.

From EP 0 023 231 B1 a microlithographic projection exposure apparatus is known that has, in order to hold a support for a semiconductor wafer to be exposed, an open-topped container whose upper edge is higher than the lower delimiting surface of the projection objective. The container is provided with feed and discharge lines for an immersion liquid, which is circulated in a liquid circuit. When the projection exposure apparatus is in operation, the immersion liquid fills the interspace which is left between the semiconductor wafer to be exposed and a boundary surface of the projection exposure objective, which faces it. The resolving power of the projection objective is increased because the refractive index of the immersion liquid is higher than that of air.

The known projection exposure apparatus furthermore has a device for regulating the temperature of the immersion liquid, which is arranged in the liquid circuit. The temperature of the semiconductor wafer to be exposed can thereby be kept constant, so as to avoid imaging errors due to thermally induced movements of the semiconductor wafer.

The use of immersion liquids in microlithographic projection exposure apparatus is also known from JP 10-303 114 A. This addresses the problem that undesirable temperature fluctuations of the immersion liquid can also cause a deterioration of the imaging properties of the projection objective. The reason for this involves the dependency of the refractive index of the immersion liquid on the temperature. In order to resolve this problem, various measures are proposed by which the temperature of the immersion liquid can be kept constant within narrow limits during operation of the projection exposure apparatus.

SUMMARY OF THE INVENTION

It is an object of the present invention to provide a method and a microlithographic projection exposure apparatus of the type, in which the optical imaging properties of a projection objective can be improved even more easily and effectively once it has finally been installed.

This object is achieved, with a projection objective which is part of a microlithographic projection exposure apparatus for projecting a reticle, arranged in an object plane of the projection objective, onto a photosensitive surface that is arranged in an image plane of the projection objective, by a method comprising the following steps:

a) introducing an immersion liquid into an interspace between the photosensitive surface and an end face of the projection objective, which faces the photosensitive surface;

b) determining an imaging property of the projection objective;

c) comparing the imaging property determined in step b) with a target imaging property;

d) changing the temperature of the immersion liquid until the imaging property as determined in step b) is as close as possible to the target imaging property.

In order to improve the optical imaging properties of the projection objective, use is made of the discovery that the immersion liquid constitutes an optical component of the projection exposure apparatus, which in principle influences its optical properties just as much as, for instance, the lenses arranged in the projection objective. Instead of now adjusting (exclusively) the lenses or other optical components inside the projection objective mechanically in the optical path of the projection objective, the invention exploits the possibility of influencing the refractive index of the "immersion liquid" optical component via its temperature.

Although in principle it is also possible to change the refractive index of the optical components contained in the projection objective via the temperature, a temperature change is very much more difficult to achieve there since the materials used for lenses and the like have a low thermal conductivity, which makes it considerably harder to set a homogeneous temperature distribution throughout the optically active volume. Conversely, the temperature of the immersion liquid can quite easily be brought to a predeterminable value and kept constant over the corresponding optically active region, for example by circulating the liquid.

Since the refractive index of many liquids suitable as an immersion liquid depends only very weakly and—within small temperature intervals—approximately linearly on the temperature, the refractive index of the immersion liquid can be set very precisely via the temperature. With a projection exposure apparatus designed for a wavelength of 193 nm, for example, in which the interspace between the photosensitive surface and the end face of the projection objective is filled with a 1 mm thick layer of water, the refractive index n=1.45 can be varied by one hundredth of a part per thousand by raising or lowering the temperature by 50 mK.

In order to determine the imaging property, it is in theory possible to position an additional optical system in the image plane of the projection objective, so that an image generated by the projection objective can be observed directly on a screen or through an eyepiece. More simply, the imaging property may be determined by projecting a test reticle through the projection objective and the immersion liquid onto a photosensitive element arranged in the image plane. The imaging properties can then be determined reproducibly and quantifiably by using instruments, which are known per se, to analyse the image stored on the photosensitive element. For example, a photoemulsion may be envisaged as the photosensitive element.

It is nevertheless particularly advantageous for the photosensitive element to be a sensor device, in particular a CCD sensor. In this way, the image generated in the image plane can be directly recorded and evaluated, i.e. without developing a photoemulsion or the like, in order to determine the imaging properties.

As an alternative to this, the imaging property may also be determined by using an interferometer as known, for example, from WO 01/632 33 A1.

By using the method according to the invention, it is possible to improve all optical imaging properties of the projection objective which can be influenced by the immersion liquid. For example, the optical imaging property to be improved may be a spherical aberration caused by the projection objective. Such spherical aberrations occur particularly in projection objectives with a high numerical aperture.

The optical imaging property to be improved may also, for example, be the focal length of the projection objective. Since very accurate arrangement of the reticle in the focal plane of the projection objective is necessary so that a high-resolution image of the structures to be projected—which are contained in this reticle—can be formed on the photosensitive surface, conventional types of projection exposure apparatus often have an adjustment feature with which the support of the photosensitive surface can be moved along the optical axis of the projection objective. In this way, it is possible to position the photosensitive surface in the focal plane of the projection objective. These mechanical adjustment devices, however, have quite elaborate designs. By changing the temperature of the immersion liquid, it is very easy to influence the focal length of the projection objective so that an adjustment feature for the support of the photosensitive surface may be obviated.

If a projection exposure apparatus comprises a sensor device—in particular a CCD sensor—which can be arranged in the image plane of the projection objective, a temperature control device for setting a target temperature of the immersion liquid, and a computer unit which is connected to the temperature control device, the latter may be used to determine the target temperature of the immersion liquid from signals generated by the sensor device.

Such a projection exposure apparatus allows automated improvement of the optical imaging properties of the projection objective by changing the temperature of the immersion liquid. The computer unit may, for example, be designed so that it determines the imaging properties of the projection objective from the signals generated by the sensor device, and compares them with a target imaging property. In a control process, the computer unit then causes the temperature management device to change the temperature of the immersion liquid until the imaging property as recorded by the sensor device is as close as possible to the target imaging property. Such a projection exposure apparatus allows an operator to compensate automatically for certain deteriorations of the imaging properties of the projection objective, i.e. without drawing in specialists, by changing the refractive index of the immersion liquid. Possible causes of the deteriorations may, for example, be ageing-induced material modifications or fluctuations in the air pressure.

BRIEF DESCRIPTION OF THE DRAWINGS

Various features and advantages of the present invention may be more readily understood with reference to the following detailed description taken in conjunction with the accompanying drawing in which.

DESCRIPTION OF PREFERRED EMBODIMENTS

Figure 1:
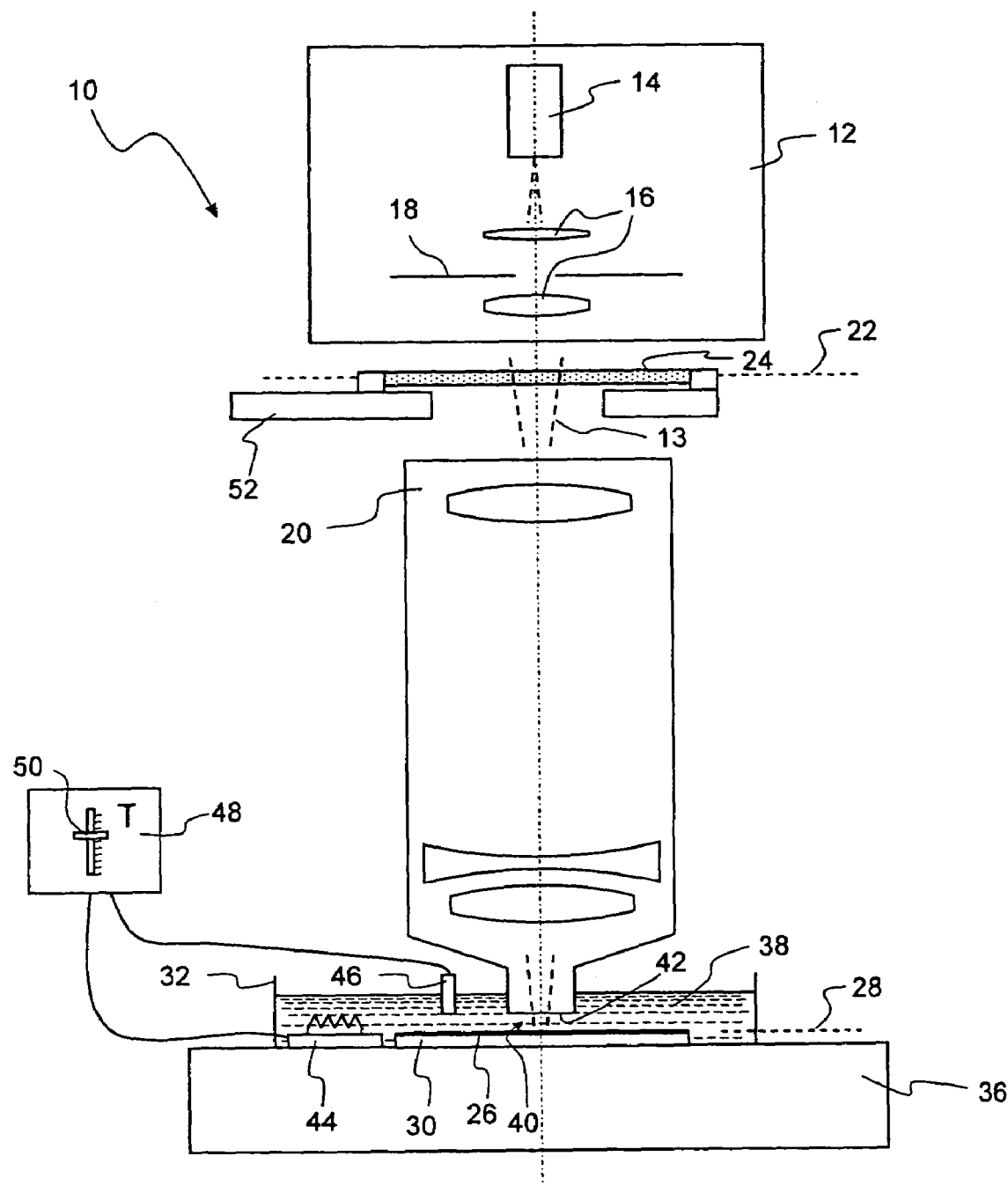
FIG. 1 is a simplified representation of a microlithographic projection exposure apparatus in a longitudinal section.

FIG. 1 shows a microlithographic projection exposure apparatus, denoted in its entirety by 10, in a longitudinal section. The projection exposure apparatus 10 comprises an illumination system 12 for generating a projection light beam 13, which includes a projection light source 14, illumination optics indicated by 16 and a diaphragm 18.

The projection exposure apparatus 10 furthermore comprises a projection objective 20 which projects a reduced image of a mask 24, arranged in its object plane 22, onto a photosensitive surface 26 arranged in an image plane 28 of the projection objective 20. The projection objective 20 contains a multiplicity of optical components, only some of which (not dealt with in detail) are represented by way of example in FIG. 1.

The photosensitive surface 26 may, for example, be a photoresist which is applied on a support 30, for example a silicon wafer. The support is fastened on the bottom of an open-topped container 32 with the shape of a trough, which can be displaced parallel to the image plane by a first displacement device denoted by 36. The container 32 is filled sufficiently high with an immersion liquid 38 so that an interspace 40 between the photosensitive surface 26 and an end face 42 of the projection objective 20 is filled completely with the immersion liquid 38.

The container 32 also contains a temperature regulating device 44, which may include a heating device or alternatively a combined heating/cooling device. A temperature sensor 46, which records the temperature of the immersion liquid 38 very accurately, is fastened on the inside of the container 32.

The temperature regulating device 44 and the temperature sensor 46 are connected, via lines which do not impede the displacement of the container 32, to a temperature controller 48 which has a slide switch 50 for adjusting a setpoint temperature.

The reticle 24, whose structures are intended to be projected onto the photosensitive surface 26, can be displaced in the object plane 22 by using a second displacement device 52, so that images of the entire structured region of the reticle 24 can progressively be formed on the photosensitive surface 26.

The projection exposure apparatus 10 functions in the following way:

The projection light beam 13 generated by the illumination device 12 passes through the structures of the reticle 24 and enters the projection objective 20. On the photosensitive surface 26, the latter forms a reduced image of the structures through which the projection light beam 13 has passed. In order to project the entire area of the reticle 24 onto the photosensitive surface 26, the reticle 24 may be illuminated in a "step and scan" process. In this case, the entire region of the reticle 24 is illuminated by scanning while the second displacement device 52 moves the reticle 24 through the projection light beam delimited by the diaphragm 18. During this scanning movement, the container 32 with the support 30 fastened in it is subjected to a movement (usually in the opposite direction) by using the first displacement device 36, the displacement speed of which is reduced relative to that of the reticle 24 by the reduction ratio of the projection objective 20.

During this displacement of the container 32, the end face 42 of the projection objective 20 is moved through the immersion liquid 38 carried along by the container 32, which leads to mixing of the immersion liquid 38. Such mixing is desirable since the immersion liquid 38 may become locally heated by the projection light passing through, so that the temperature sensor 46 might otherwise possibly not measure the temperature actually prevailing in the interspace 40. If the mixing due to the displacement of the container 32 is not sufficient, additional mixing devices may of course be arranged in the container 32. It is likewise possible to fit the container 32 in a liquid circuit, as is known per se in the prior art. The temperature regulating device 44 and the temperature sensor 46 may then be integrated in this temperature circuit alongside a filter which may optionally be provided.

If it is found during a test process when adjusting the projection objective, or during subsequent operation by checking the wafers which are produced, that the imaging properties of the projection objective 20 do not correspond to an intended target imaging property, for example because the imaging on the photosensitive surface 26 is distorted by spherical aberration, then the setpoint temperature of the temperature controller 48 is changed by actuating the slide switch 50 and the exposure is repeated. Changing the temperature of the immersion liquid 38 changes its refractive index. The dependency of the refractive index on the temperature—at least in small temperature intervals—is approximately linear for many immersion liquids 38, so that a temperature at which one or more imaging properties of the projection objective 20 are improved can be determined very straightforwardly for the immersion liquid 38 in a recursive process. The further exposure of photosensitive surfaces 26 is then carried out at this finally adjusted temperature of the immersion liquid 38.

The effect of the refractive index of the immersion liquid 38 on the imaging properties of the projection objective 20 will be explained in more detail below with reference to FIGS. 2 to 5.

Figure 2:
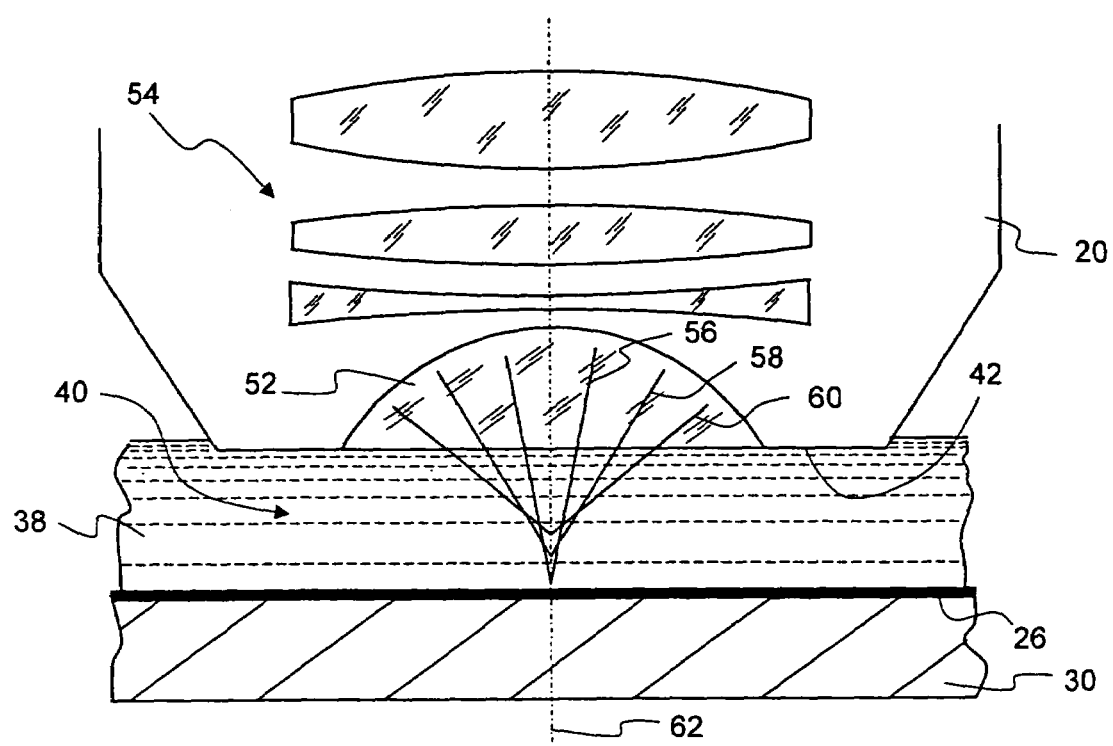
FIG. 2 shows an enlarged detail of FIG. 1, in which ray paths in the region of an immersion liquid are indicated.

FIG. 2 shows an enlarged detail of FIG. 1, in which a ray path is indicated in the region of the interspace 40 between the end face 42 of the projection objective 20 and the photosensitive surface 26. In this exemplary embodiment, the end face 42 of the projection objective 20 includes a flush-fitted planoconvex terminating lens 52 which constitutes the last optical component of the projection optics (merely indicated by 54) of the projection objective 20. For illustrative purposes, FIG. 2 indicates a plurality of projection light rays 56, 58, 60 which propagate through the preceding optical components of the projection objective 20 towards the terminating lens 52. The representation is highly schematised and not true to scale in order to show the effect of the temperature on the imaging properties of the projection objective 20 more clearly.

The projection objective 20 shown in FIG. 2 produces an image distorted by spherical aberration. This means that the focal lengths are respectively different for the near-axis projection light rays 56 and for the off-axial projection light beams 58 and 60. In FIG. 2, only the focal plane of the near-axis projection light rays 56 lies in the plane of the photosensitive surface 26, whereas the focal planes of the off-axial projection light rays 58 and 60 lie in the interspace 40. The distance of the focal planes from the photosensitive surface 26 in this case increases commensurately when the projection light rays 56, 58, 60 pass through the terminating lens 52 further away from the optical axis denoted by 62.

Figure 3:
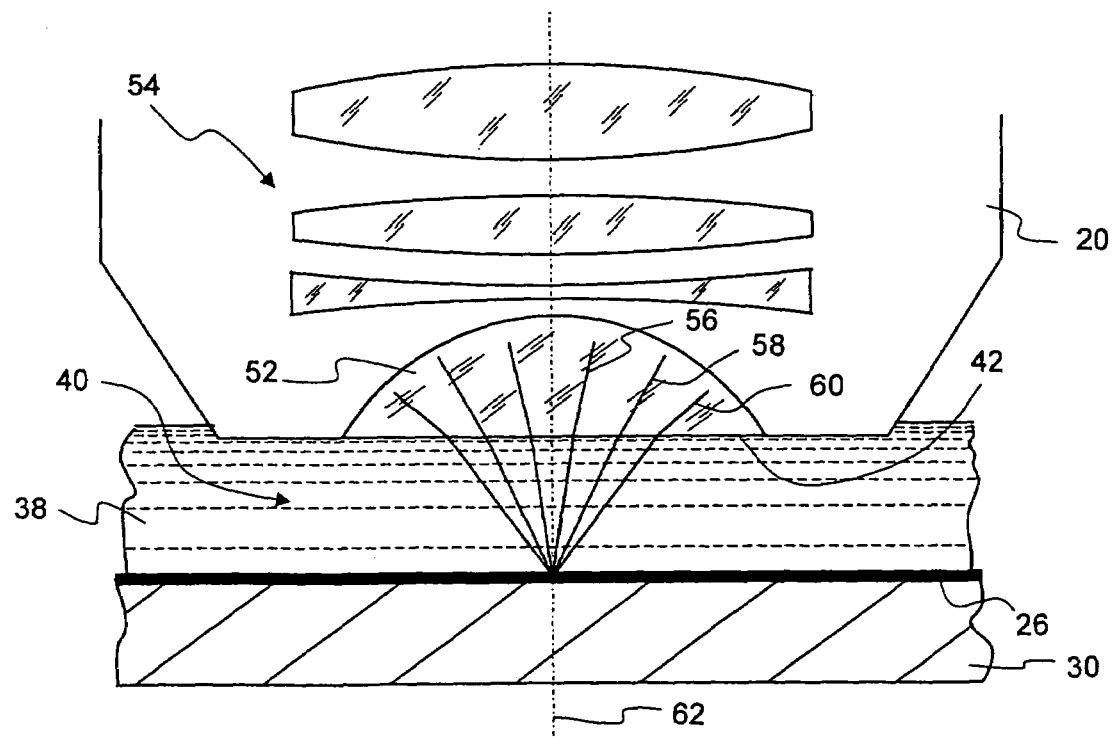
FIG. 3 shows the detail according to FIG. 2, but after raising the temperature of the immersion liquid.

FIG. 3 shows the detail in FIG. 2 after the temperature of the immersion liquid 38 has been raised. The immersion liquid now has a higher refractive index than in the state shown in FIG. 2. The effect of this is that the projection light rays 56, 58, 60 are refracted more strongly at the interface between the terminating lens 52 and the immersion liquid 38. This stronger refraction has a commensurately greater effect the further the projection light rays are away from the optical axis 62, since the off-axial projection light rays pass through this interface at a larger angle. The result of this is that the focal length of the projection objective 20 is extended for the off-axial rays so that, in the ideal case with a correspondingly selected temperature, the focal planes of all the projection light rays 56, 58, 60 coincide with the image plane in 28 which the photosensitive surface 26 is arranged.

By changing the temperature of the immersion liquid 38, it is thus possible to compensate retrospectively for an inherent spherical aberration in the projection objective 20.

Figure 4:
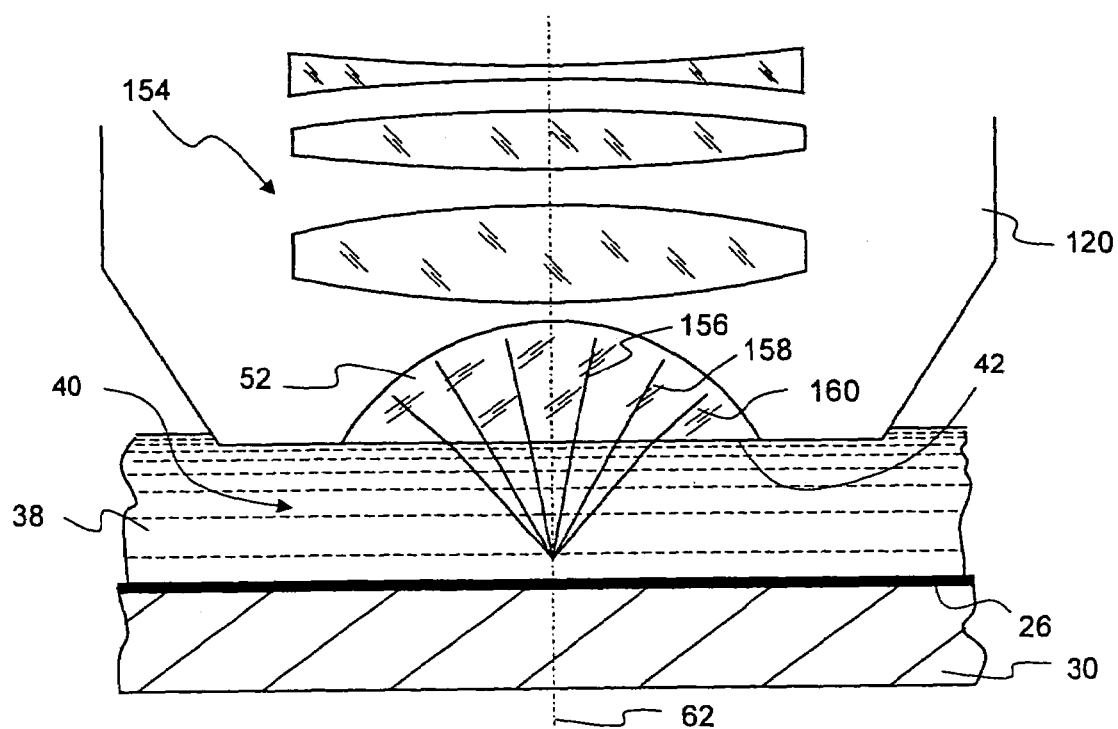
FIG. 4 shows an enlarged detail, corresponding to FIG. 2, of a projection exposure apparatus having different imaging optics.

FIG. 4 shows an enlarged detail, corresponding to FIG. 2, of a projection exposure apparatus having a different projection objective 120. In this embodiment, parts modified with respect to FIG. 2 are denoted by reference numerals that are increased by 100.

Unlike the projection optics 54 shown in FIGS. 2 and 3, the projection optics 154 of the projection objective 120 do not have an inherent spherical aberration. The projection light rays 156, 158, 160 therefore meet at a focal point. As can be seen in FIG. 4, however, this focal point does not lie in the image plane 28, i.e. the projection objective 120 has a focusing error. Such a focusing error could, for example, be remedied by slightly displacing the support 30 with the photosensitive surface 26 in the direction of the optical axis 62 with the use of a suitable displacement device. Unfortunately, the accuracy required for this can be achieved only with great technical outlay when mechanical displacement devices are used.

Figure 5:
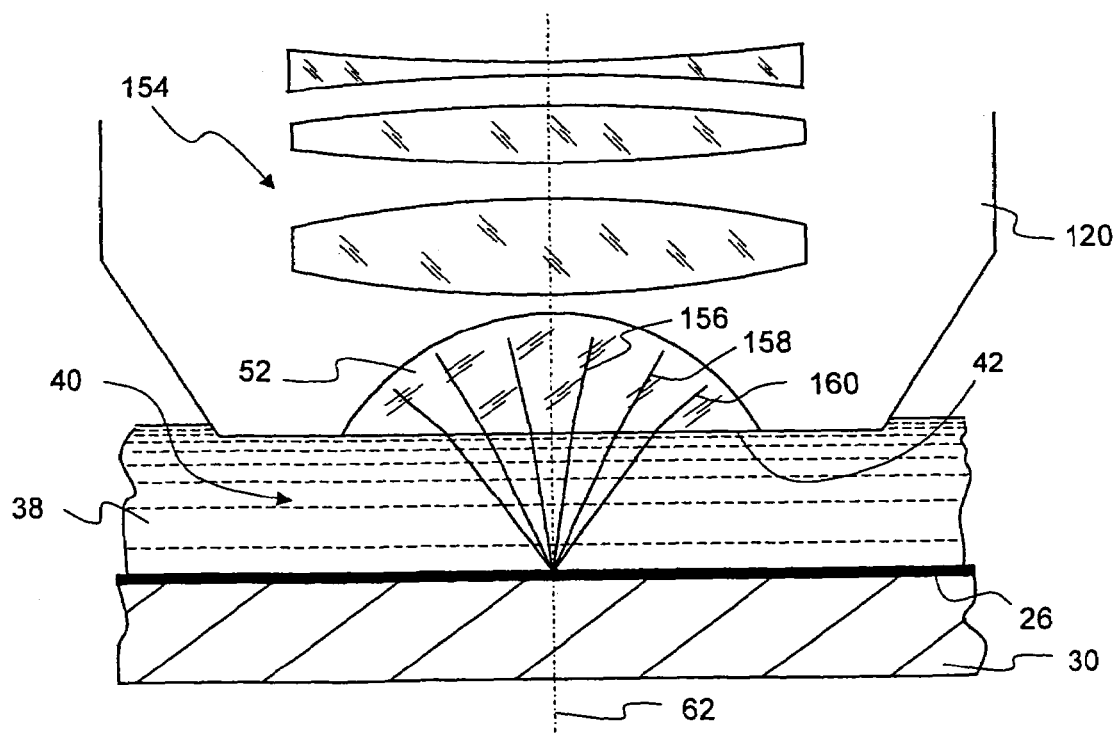
FIG. 5 shows the detail according to FIG. 4, but after raising the temperature of the immersion liquid.

As shown by FIG. 5, it is likewise possible to extend the focal length of the projection objective 120 deliberately by raising the temperature of the immersion liquid 38. Admittedly, this does introduce a spherical aberration (not represented in FIG. 5). Nevertheless, the effects of such a spherical aberration may be so small that they are negligible in view of the optimisation of the focal length of the projection objective, or they can be compensated for by other measures.

Figure 6:
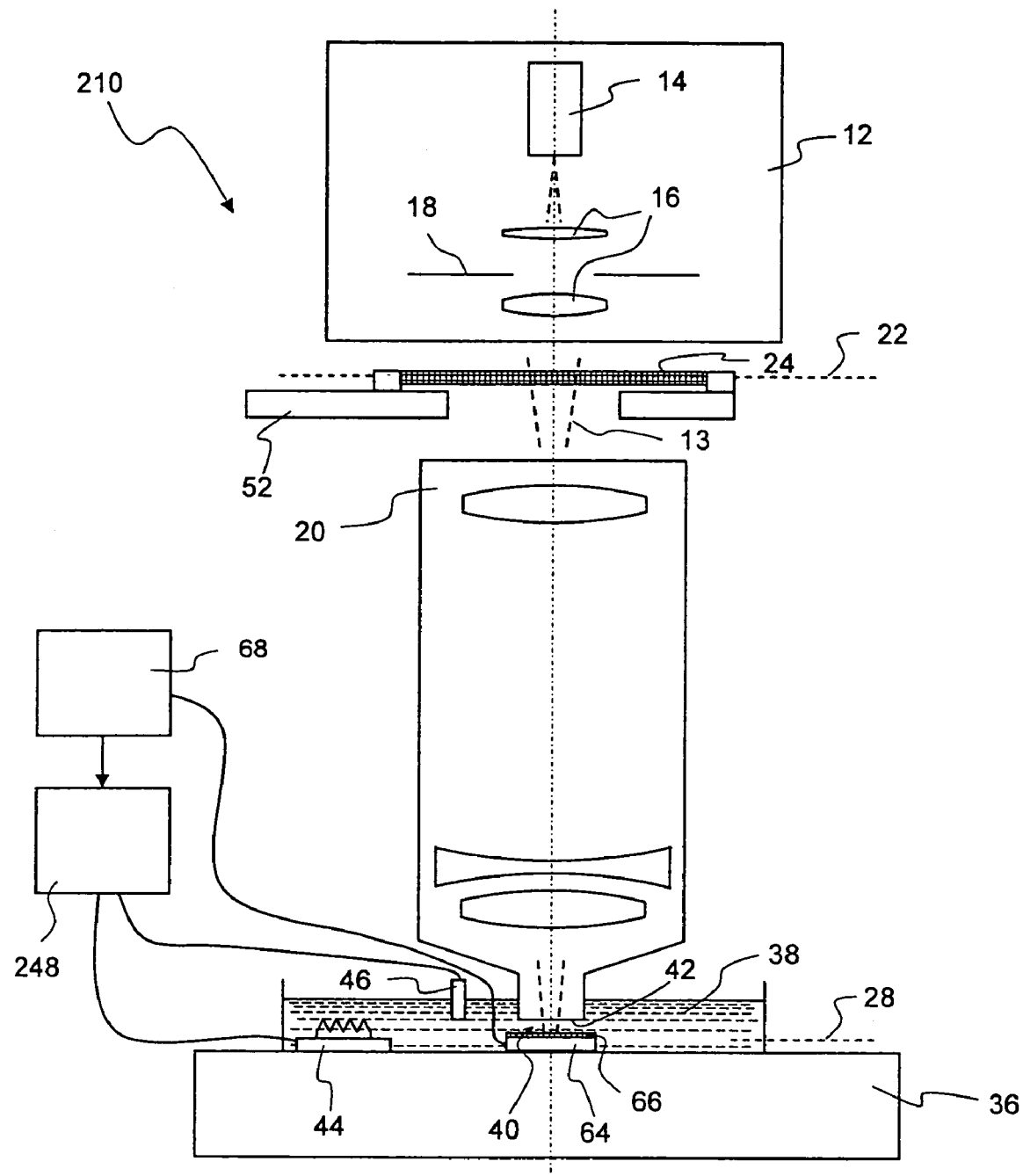
FIG. 6 shows a simplified representation of another microlithographic projection exposure apparatus, having a sensor device arranged in the image plane, in a longitudinal section.

FIG. 6 shows details of another exemplary embodiment with a projection exposure apparatus denoted in its entirety by 210, in a representation similar to FIG. 1. Here again, parts modified with respect to the embodiment shown in FIG. 1 are provided with reference numerals increased by 200.

FIG. 6 shows the projection exposure apparatus 210 in an adjustment mode, in which the support 30 is replaced by a sensor device 64. The sensor device 64 may, for example, be a CCD sensor, as it is known per se in the art. In the adjustment mode, the photosensitive surface 66 of the sensor device 64 is arranged in the image plane 28 of the projection objective 20. In this way, the sensor device 64 records exactly the same image as the one to which the photosensitive surface 26 is exposed during the normal projection mode. The projection is in this case carried out using a special test reticle 70, which is arranged in place of the normal reticle 24 in the object plane 22 of the projection objective 20.

Instead of the CCD sensor, it is also possible to use an interferometer as the sensor device in a manner which is known per se. Wavefronts in pupil planes can thereby be recorded. This is described in more detail in the aforementioned WO 01/63233 A1.

In contrast to the projection exposure apparatus 10 in FIG. 1, the projection exposure apparatus 210 furthermore has a computer unit 68 which is connected to a temperature controller 248 for the temperature regulating device 44. In the adjustment mode, the projection exposure apparatus 210 functions in the following way:

First, an image of the structures contained on the test reticle 70 is formed on the photosensitive surface 66 of the sensor device 64 by the projection objective 20. This image is recorded by the sensor device 64 and transmitted in digital form to the computer unit 68. From the data received, the latter determines a setpoint temperature which is sent to the temperature controller 248. The temperature controller 248 then ensures that the immersion liquid 38 is brought to this new setpoint temperature. The sensor device 64 records the image of the structures of the test reticle 70 as modified by the temperature change, and likewise feeds these data to the computer unit 68. By using algorithms which are known per se, the computer unit 68 establishes whether the temperature change has led to an improvement or deterioration in the imaging properties of the projection objective 120. The setpoint temperature is changed again in accordance with this result. This recursive process is continued until it is no longer possible to improve the imaging properties of the projection objective by changing the temperature.

What is claimed is:

1. A method for improving an optical imaging property of a projection objective which is part of a microlithographic projection exposure apparatus for projecting a reticle, arranged in an object plane of the projection objective, onto a photosensitive surface that is arranged in an image plane of the projection objective, said method comprising the following steps:
    a) introducing an immersion liquid into an interspace between the photosensitive surface and an end face of the projection objective, which faces the photosensitive surface;
    b) determining an imaging property of the projection objective;
    c) comparing the imaging property determined in step b) with a target imaging property;
    d) adjusting the imaging property by changing the temperature of the immersion liquid until the imaging property as determined in step b) is as close as possible to the target imaging property.

2. The method of claim 1, wherein the imaging property is determined by projecting a test reticle onto a photosensitive element arranged in the image plane.

3. The method of claim 2, wherein the photosensitive element is a sensor device.

4. The method of claim 3, wherein the sensor device is a CCD sensor.

5. The method of claim 1, wherein the imaging property is determined by using an interferometer.

6. The method of claim 1, wherein the optical imaging property is the spherical aberration caused by the projection objective.

7. The method of claim 1, wherein the optical imaging property is the focal length of the projection objective.

8. A microlithographic projection exposure apparatus, comprising:
    a) a projection objective having an object plane and an image plane and which is configured for projecting a reticle arranged in the object plane onto a photosensitive surface arranged in the image plane,
    b) a filling device for introducing an immersion liquid into an interspace formed between the photosensitive surface and an end face of the projection objective,
    c) a sensor device for generating a signal indicative of an imaging property of the projection objective, wherein the sensor device is configured to be arranged in the image plane of the projection objective,
    d) a temperature control device for setting a target temperature of the immersion liquid, and
    e) a computer unit operably connected to the temperature control device and the sensor device, the computer unit adapted to determine the target temperature of the immersion liquid from the signal generated by the sensor device.

9. The apparatus of claim 8, wherein the sensor device comprises a CCD sensor.

10. A microlithographic projection exposure apparatus, comprising:
    a) a projection objective having an object plane and an image plane and which is configured for projecting a reticle arranged in the object plane onto a photosensitive surface arranged in the image plane,
    b) an immersion liquid in an interspace between the photosensitive surface and an end face of the projection objective, said immersion liquid having a temperature that is selected such that the immersion liquid compensates for a measured aberration of the projection objective.

11. The apparatus of claim 10, wherein the aberration is a spherical aberration.

* * * * *